(12) United States Patent
Vezina et al.

(10) Patent No.: US 10,539,598 B2
(45) Date of Patent: Jan. 21, 2020

(54) ACCESS WINDOWS IN HORIZONTAL BAR SECTION OF AN ELECTRICAL METER CENTER

(71) Applicant: Siemens Canada Limited

(72) Inventors: Sebastien Vezina, St-Celestin (CA); Maxime Boivin, St-Mathieu-de-Beloeil (CA)

(73) Assignee: SIEMENS CANADA LIMITED, Ontario (CA)

( * ) Notice: Subject to any disclaimer, the term of this patent is extended or adjusted under 35 U.S.C. 154(b) by 265 days.

(21) Appl. No.: 15/171,631

(22) Filed: Jun. 2, 2016

(65) Prior Publication Data
US 2016/0359307 A1    Dec. 8, 2016

Related U.S. Application Data

(60) Provisional application No. 62/170,181, filed on Jun. 3, 2015, provisional application No. 62/170,183, filed
(Continued)

(51) Int. Cl.
| | |
|---|---|
| *G01R 22/06* | (2006.01) |
| *H02G 3/10* | (2006.01) |
| *H02G 5/04* | (2006.01) |
| *H05K 5/00* | (2006.01) |
| *H05K 5/02* | (2006.01) |
| *H05K 5/04* | (2006.01) |

(Continued)

(52) U.S. Cl.
CPC ........... *G01R 22/065* (2013.01); *G01R 22/00* (2013.01); *H02B 1/03* (2013.01); *H02B 1/04* (2013.01); *H02B 1/14* (2013.01); *H02B 1/20* (2013.01); *H02G 3/086* (2013.01); *H02G 3/10* (2013.01); *H02G 3/185* (2013.01); *H02G 3/22* (2013.01); *H02G 5/04* (2013.01); *H05K 5/0004* (2013.01); *H05K 5/0204* (2013.01); *H05K 5/0217* (2013.01); *H05K 5/0239* (2013.01); *H05K 5/04* (2013.01); *H02G 3/081* (2013.01)

(58) Field of Classification Search
None
See application file for complete search history.

(56) References Cited

U.S. PATENT DOCUMENTS

| | | | | |
|---|---|---|---|---|
| 1,307,019 A | * | 6/1919 | Olley | H02B 1/056 361/648 |
| 3,710,198 A | * | 1/1973 | Burton | H02B 1/21 174/72 B |

(Continued)

*Primary Examiner* — Dimary S Lopez Cruz

(57) ABSTRACT

An electrical meter center comprises a horizontal bar section comprising horizontal bus bars, the horizontal bus bar section defining a first connection section for the horizontal bus bars and a second connection section for the horizontal bus bars, the second connection section being laterally distant from the first connection section; and a wall panel assembly for covering a horizontal bar section of an electrical meter center. The wall panel assembly comprises a wall panel vertically mounted within the electrical meter center in front of the horizontal bar section, wherein the wall panel comprising an access window for accessing the horizontal bar section; and an access window panel selectively mounted to the wall panel to at least partially close the access window thereby providing selective access to the horizontal bar section.

12 Claims, 13 Drawing Sheets

Related U.S. Application Data on Jun. 3, 2015, provisional application No. 62/170,184, filed on Jun. 3, 2015, provisional application No. 62/170,187, filed on Jun. 3, 2015, provisional application No. 62/170,188, filed on Jun. 3, 2015, provisional application No. 62/170,190, filed on Jun. 3, 2015, provisional application No. 62/170,192, filed on Jun. 3, 2015.

(51) Int. Cl.
| | | |
|---|---|---|
| *H02G 3/08* | (2006.01) | |
| *H02G 3/18* | (2006.01) | |
| *H02G 3/22* | (2006.01) | |
| *G01R 22/00* | (2006.01) | |
| *H02B 1/04* | (2006.01) | |
| *H02B 1/14* | (2006.01) | |
| *H02B 1/20* | (2006.01) | |
| *H02B 1/03* | (2006.01) | |

(56) References Cited

U.S. PATENT DOCUMENTS

| | | | |
|---|---|---|---|
| 4,916,574 A | | 4/1990 | Hancock et al. |
| 5,160,357 A | * | 11/1992 | Faber ............... H05K 7/1424 |
| | | | 220/4.02 |
| 5,654,871 A | * | 8/1997 | Wentler ............ H02B 1/06 |
| | | | 361/614 |
| 6,205,017 B1 | | 3/2001 | Wilkie, II et al. |
| 6,433,999 B1 | * | 8/2002 | Muse ............... H02B 1/14 |
| | | | 312/223.2 |
| 7,049,516 B1 | | 5/2006 | Haag et al. |
| 7,450,368 B2 | | 11/2008 | Parker et al. |
| 7,969,750 B2 | | 6/2011 | Jur et al. |
| 9,531,168 B2 | * | 12/2016 | Bugaris ............ H02B 13/025 |
| 2009/0185332 A1 | * | 7/2009 | Coomer ........... H02B 13/025 |
| | | | 361/605 |
| 2011/0299228 A1 | | 12/2011 | Kulkarni |
| 2013/0240485 A1 | | 9/2013 | Yabu et al. |

\* cited by examiner

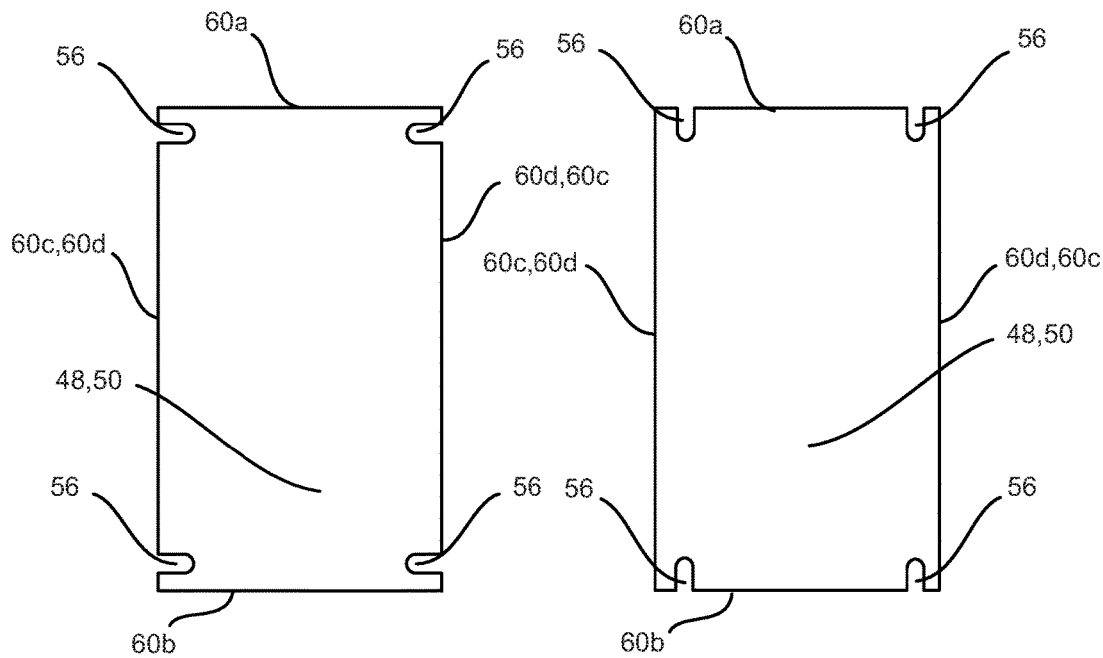
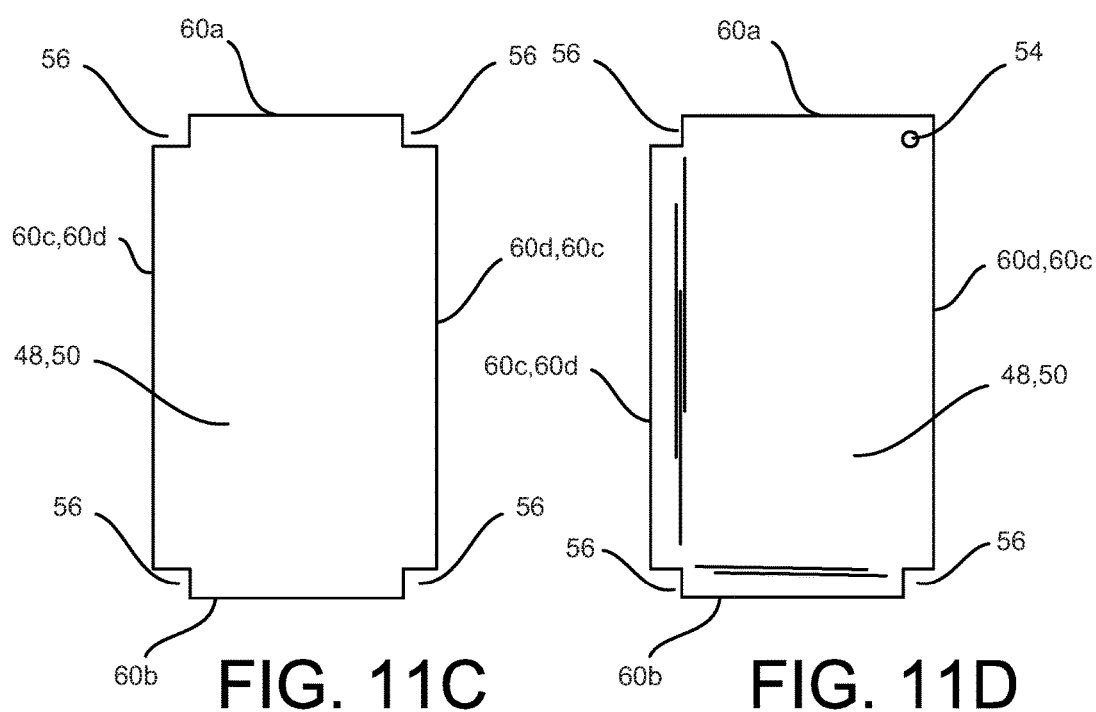

ACCESS WINDOWS IN HORIZONTAL BAR SECTION OF AN ELECTRICAL METER CENTER

CROSS-REFERENCE TO RELATED APPLICATIONS

This application claims priority from U.S. provisional patent application U.S. 62/170,181, U.S. 62/170,183, U.S. 62/170,184, U.S. 62/170,187, U.S. 62/170,188, U.S. 62/170,190 and U.S. 62/170,192, all filed Jun. 3, 2015, the specifications of which are hereby incorporated herein by reference in their entirety.

BACKGROUND (a) Field

The subject matter disclosed generally relates to electrical meter centers. More particularly, the subject matter relates to devices to control access to sections of electric meter centers, access windows and/or doors of electrical meter centers.

(b) Related Prior Art

Electrical equipment such as, without limitation, relays, circuit breakers, electrical meters, transformers, and the like, are typically housed within an enclosure, such as, for example, a housing, enclosure, box or cabinet. Such housing is provided to restrict access to the electrical equipment thereby restricting potential injuries, to resist unauthorized tampering with the electrical equipment, in general, as well as to meet CS and/or UL regulations and/or requirements.

There exists, in the electrical metering technology, commercial electrical meter centers, or electrical meter stacks (or cabinets), for commercial and industrial use, such as, without limitation, shopping centers, industrial buildings, condos, warehouses, oil and gas industries, and the like.

Such electrical meter centers include a plurality of internal sections, such as, without limitation, horizontal bar sections, breaker sections, electric meter sections, cable routing sections, and the like.

For maintenance, security and/or new installation purposes, customers, installers and/or repairmen often need to access only one of these above noted sections. In other circumstances, access is required to a plurality of the above noted sections. Yet still in other circumstances, access is only required to a portion of one of the above noted sections in the electrical meter centers.

A variety of access options to electrical meter centers have been developed. However, these access options are often complex, long, difficult and even dangerous. Better solutions are necessary to enable authorized access to the enclosed electrical equipment relatively quickly in order to install additional stacks, or cabinets, adjacent an initially installed stack, or cabinet. Better solutions are also necessary to reach the horizontal bars section of an initially installed cabinet quickly and easily.

There is therefore a need for improved access options to reach one or more section(s) of electrical meter centers during stacking additional electrical meter center post-initial installation.

SUMMARY

According to an embodiment, there is provided a wall panel assembly for covering a horizontal bar section of an electrical meter center, the wall panel assembly comprising: a wall panel vertically mounted within the electrical meter center in front of the horizontal bar section, the wall panel comprising an access window for accessing the horizontal bar section; and an access window panel selectively mounted to the wall panel to at least partially close the access window thereby providing selective access to the horizontal bar section.

According to an aspect, the access window comprises a first access window and a second access window and wherein the access window panel comprises a first access window panel and a second access window panel, each one of the first access window panel and the second access window panel being selectively mounted to the wall panel to at least partially close a corresponding one of the first access window and the second access window thereby providing selective access to two sections of the horizontal bar section.

According to an aspect, the wall panel comprises a plurality of holes surrounding the first access window and the second access window, and wherein the first access window panel and the second access window panel comprise a plurality of holes corresponding to the plurality of holes of the wall panel, both plurality of holes adapted for selectively fastening the first access window panel and the second access window panel to the wall panel.

According to an aspect, the wall panel comprises a plurality of holes about the first access window and the second access window and at least one of a bracket, a hook member, an extension and a slit near a lower edge of the first access window and the second access window, and wherein the first access window panel and the second access window panel comprise extensions at a bottom edge thereof which interface with the at least one of a bracket, a hook member, an extension and a slit, to support the first access window panel and the second access window panel at the bottom edge, and when used in conjunction with fasteners and the plurality of holes in the wall panel selectively mount the at least one of the first access window panel and second access window panel to the wall panel.

According to an aspect, the first access window and the second access window respectively comprise bottom window edges, and fingers extending away from the horizontal bar section along the bottom window edges, the fingers adapted to receive the first access window panel and the second access window panel, and which when used in conjunction with fasteners and the plurality of holes in the wall panel selectively mount the at least one of the first access window panel and second access window panel to the wall panel.

According to an aspect, the wall panel comprises a plurality of holes surrounding the first access window and the second access window, and wherein the first access window panel and the second access window panel comprise notches which when used in conjunction with fasteners and the plurality of holes in the wall panel selectively mount the at least one of the first access window panel and second access window panel to the wall panel.

According to an aspect, the first access window panel and second access window panel are symmetric according to at least one of a horizontal axis and a vertical axis.

According to an aspect, the wall panel and the access window panel each comprise at least one hole, wherein the at least one hole in each one of the wall panel and the access window panel are adapted for selectively fastening the access window panel to the wall panel.

According to an aspect, the access window panel and comprises notches which when used in conjunction with fasteners and the at least one hole in the wall panel selectively mount the at least one of the access window panel to the wall panel.

According to an aspect, the wall panel comprises exterior edges and a boundary flange located about a top one of the exterior edges of the wall panel, wherein the boundary flange extends perpendicularly to the wall panel toward horizontal bar section.

According to an aspect, the wall panel comprises exterior edges and two mounting flanges located about two opposite ones of the exterior edges of the wall panel, wherein the two mounting flanges extend perpendicularly to the wall panel away from the horizontal bar section and are used in the vertical mounting of the wall panel within the electrical meter center.

According to an aspect, the wall panel and the access window panel are made of sheet metal material.

According to an embodiment, there is provided a wall panel assembly for covering a horizontal bar section of an electrical meter center, the horizontal bar section defining a first connection section and a second connection section laterally distant from the first connection section, the wall panel assembly comprising: a wall panel adapted for vertical mounting within the electrical meter center about the horizontal bar section, the wall panel comprising: a first access window for accessing the first connection section; and a second access window, laterally distant from the first access window, for accessing the second connection section; a first access window panel adapted for releasable mounting to at least partially close the first access window; and a second access window panel adapted for releasable mounting to at least partially close the second access window.

According to an aspect, the wall panel and at least one of the first access window panel and second access window panel each comprise at least one hole, wherein the at least one hole is adapted for fastening one of the first access window panel and the second access window panel to the wall panel.

According to an embodiment, there is provided an electrical meter center comprising: a horizontal bar section comprising horizontal bus bars, the horizontal bar section defining a first connection section for the horizontal bus bars and a second connection section for the horizontal bus bars, the second connection section being laterally distant from the first connection section; and a wall panel assembly for covering a horizontal bar section of an electrical meter center, the wall panel assembly comprising: a wall panel vertically mounted within the electrical meter center in front of the horizontal bar section, the wall panel comprising an access window for accessing the horizontal bar section; and an access window panel selectively mounted to the wall panel to at least partially close the access window thereby providing selective access to the horizontal bar section.

According to an aspect, the access window comprises a first access window and a second access window and wherein the access window panel comprises a first access window panel and a second access window panel, each one of the first access window panel and the second access window panel being selectively mounted to the wall panel to at least partially close a corresponding one of the first access window and the second access window thereby providing selective access to two sections of the horizontal bar section.

According to an aspect, the wall panel comprises a plurality of holes surrounding the first access window and the second access window, and wherein the first access window panel and the second access window panel comprise a plurality of holes corresponding to the plurality of holes of the wall panel, both plurality of holes adapted for selectively fastening the first access window panel and the second access window panel to the wall panel.

According to an aspect, the wall panel comprises exterior edges and a boundary flange located about a top one of the exterior edges of the wall panel, wherein the boundary flange extends perpendicularly to the wall panel toward horizontal bar section.

According to an aspect, the wall panel comprises exterior edges and two mounting flanges located about two opposite ones of the exterior edges of the wall panel, wherein the two mounting flanges extend perpendicularly to the wall panel away from the horizontal bar section and are used in the vertical mounting of the wall panel within the electrical meter center.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which:

FIG. 11a-d are front elevation views of access window panels in accordance with other embodiments;

It will be noted that throughout the appended drawings, like features are identified by like reference numerals.

DETAILED DESCRIPTION

In embodiments there are disclosed wall panel assemblies for covering horizontal bar sections of electrical meter centers and access windows in horizontal bar section of electrical meter centers for easy access during stacking additional electrical meter centers post-initial installation.

The horizontal bar sections comprise a plurality of bars, aka electrical conducting components, that are connected to an electrical source and that carry an incoming current from the source into the electrical meter center.

Figure 1:
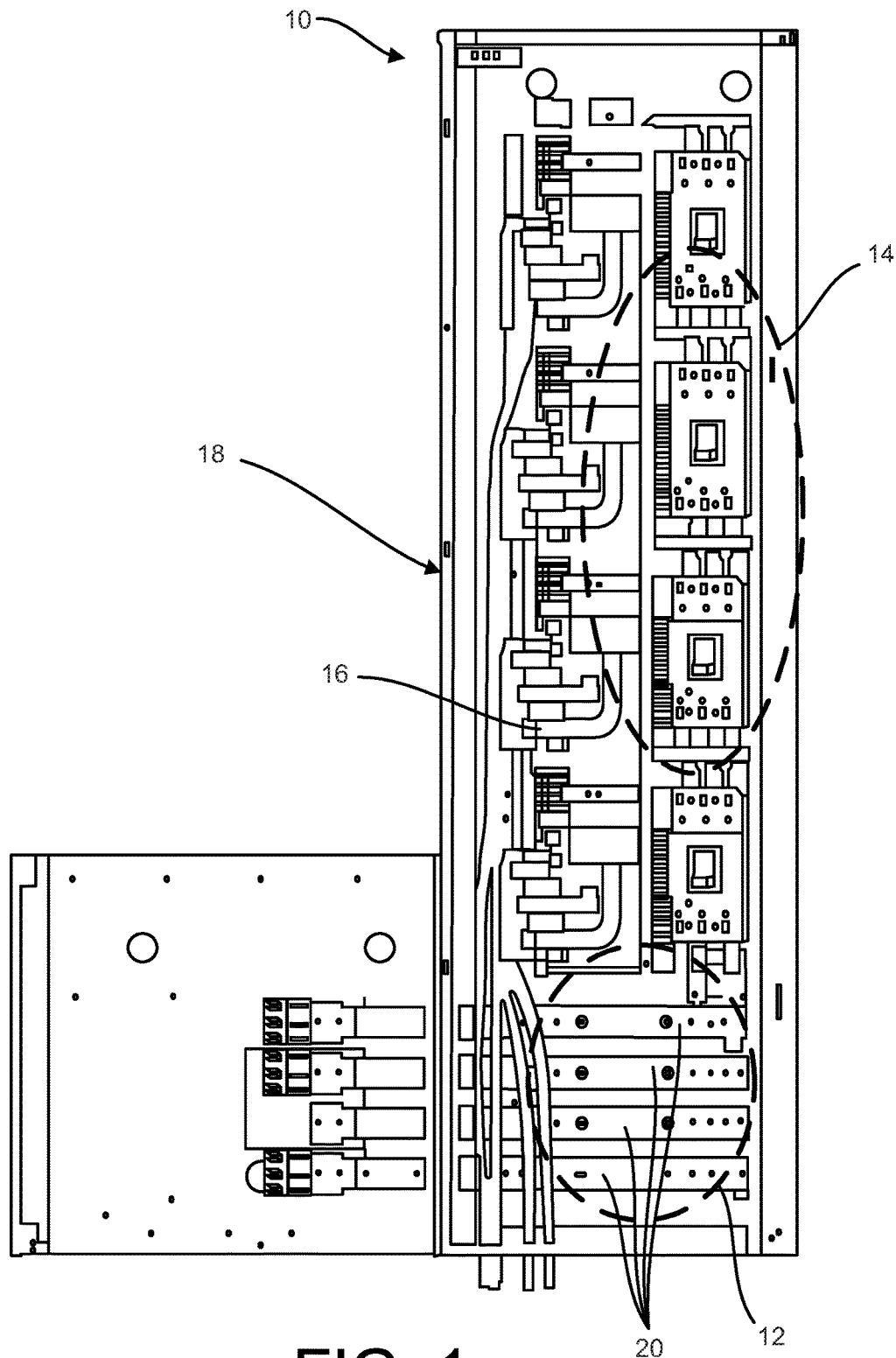
FIG. 1 is a perspective view of an electrical meter center in accordance with an embodiment, showing at least its horizontal bar section, its breaker section, its meter section, and its cable routing section.

Referring now to the drawings, and more particularly to FIG. 1, there is shown an electrical meter center 10 which includes a plurality of internal sections. The electrical meter center 10 includes, without limitation, a horizontal bar section 12, a breaker section 14, an electric meter section 16, a cable routing section 18, and the like.

Figure 2:
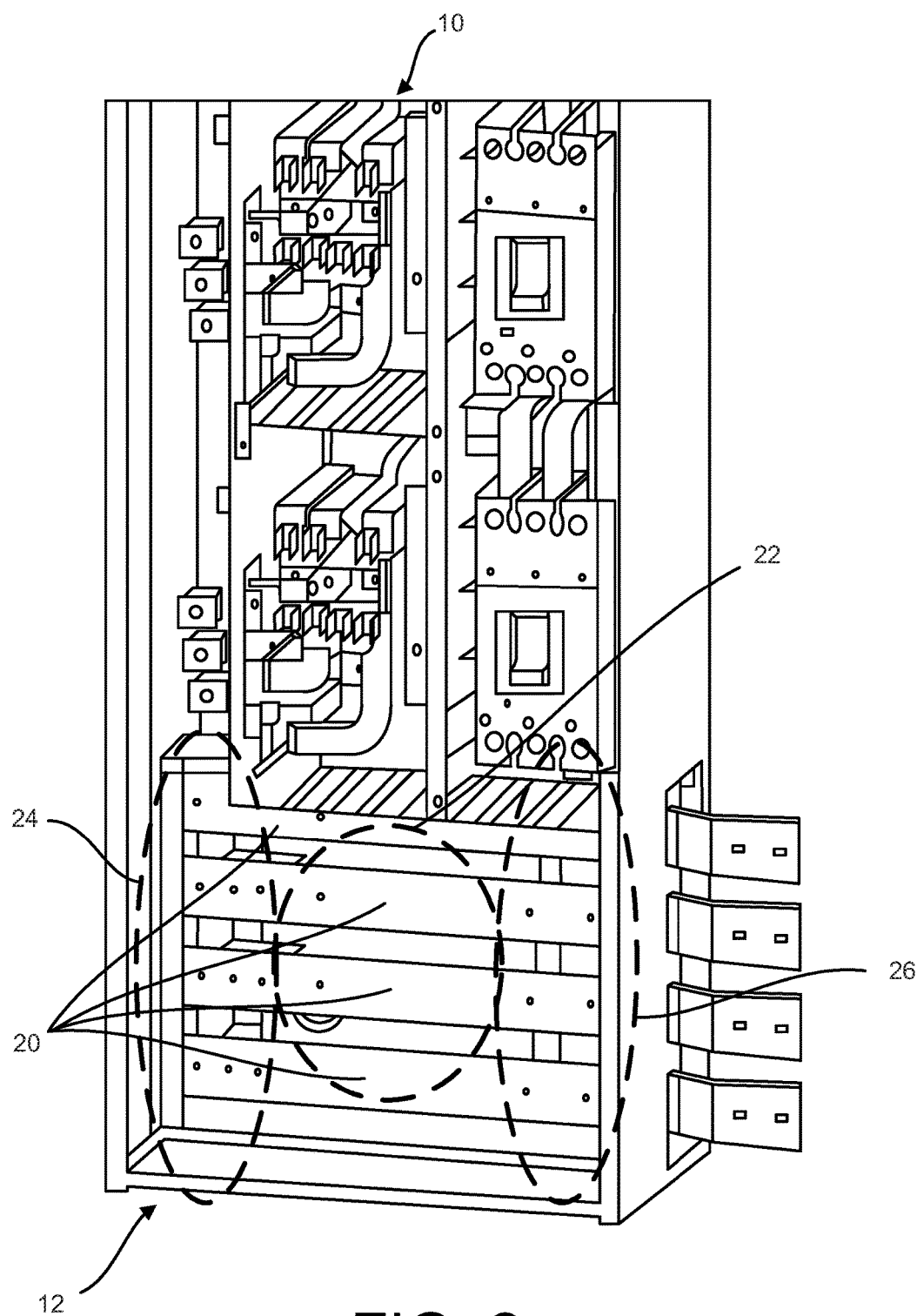
FIG. 2 is a close-up view of the horizontal bar section of the electrical meter center shown in FIG. 1.

Referring now additionally to FIG. 2, there is shown a close-up view of the horizontal bar section 12. The four horizontal bars 20 (three phases and a neutral) will be connected later on with four vertical bars (not shown, also three phases and a neutral) via the horizontal bar section 12 of the electrical meter center 10. For obvious safety reasons, there exists CSA/UL regulatory requirements to provide a cover (not shown) over the four horizontal bars 20 and therefore close off the horizontal bar section 12.

Figure 5:
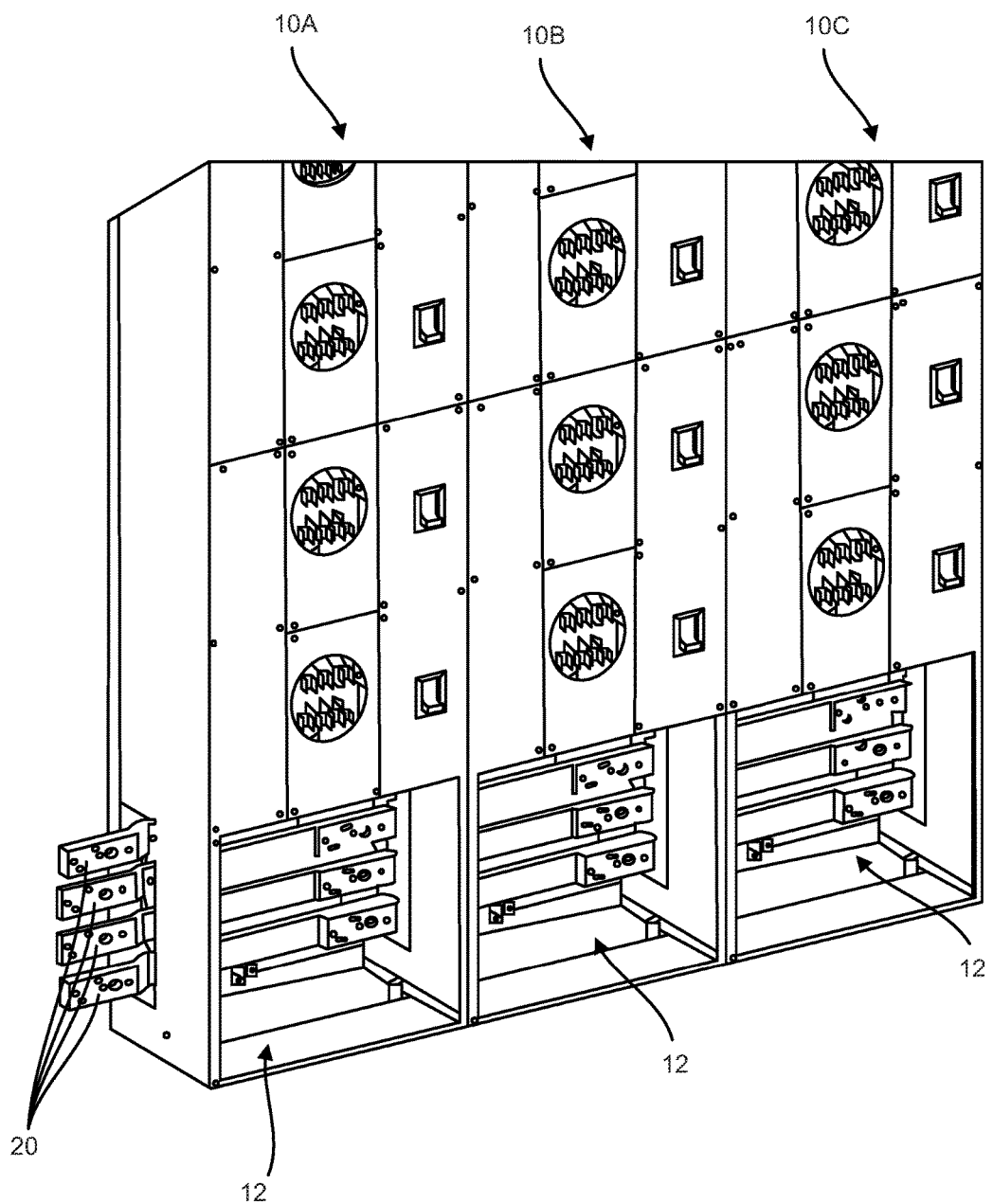
FIG. 5 is a perspective view of three electrical meter centers installed side to side in accordance with a further embodiment, showing their respective horizontal bar section uncovered.

When an additional electrical meter center must be installed and connected to the originally installed electrical meter center 10 (thus stacked), the horizontal bars of the additional electrical meter center must be connected to the horizontal bars 20 of the originally installed electrical meter center 10. Under normal circumstances, the cover (not shown) must be removed in order to access the first connection section 24 if a stack is added on the left side (as illustrated in FIG. 2), and to second connection section 26 if a stack is added on the right side (as illustrated in FIG. 5), and make the connections between the horizontal bars of additional electrical meter center to the horizontal bars 20 of the originally installed electrical meter center 10. The removal of the cover can be complex, long, difficult and even dangerous, especially when the customer cables in the cable routing section 18 are exiting the enclosure at the bottom on the floor side, or displaced. One must imagine that up to sixteen cables can be routed and exiting the enclosure by the tub end on the floor side. These cables are rigid and can hardly be displaced to access the horizontal bars separator for removal and screwing of the additional stack horizontal bars over it. In most circumstances, other components of the electrical meter center 10 must be removed in order to access the screws holding the cover in place. Simplifying this procedure and making it quicker and safer are advantages of the embodiments described herein.

Figure 3:
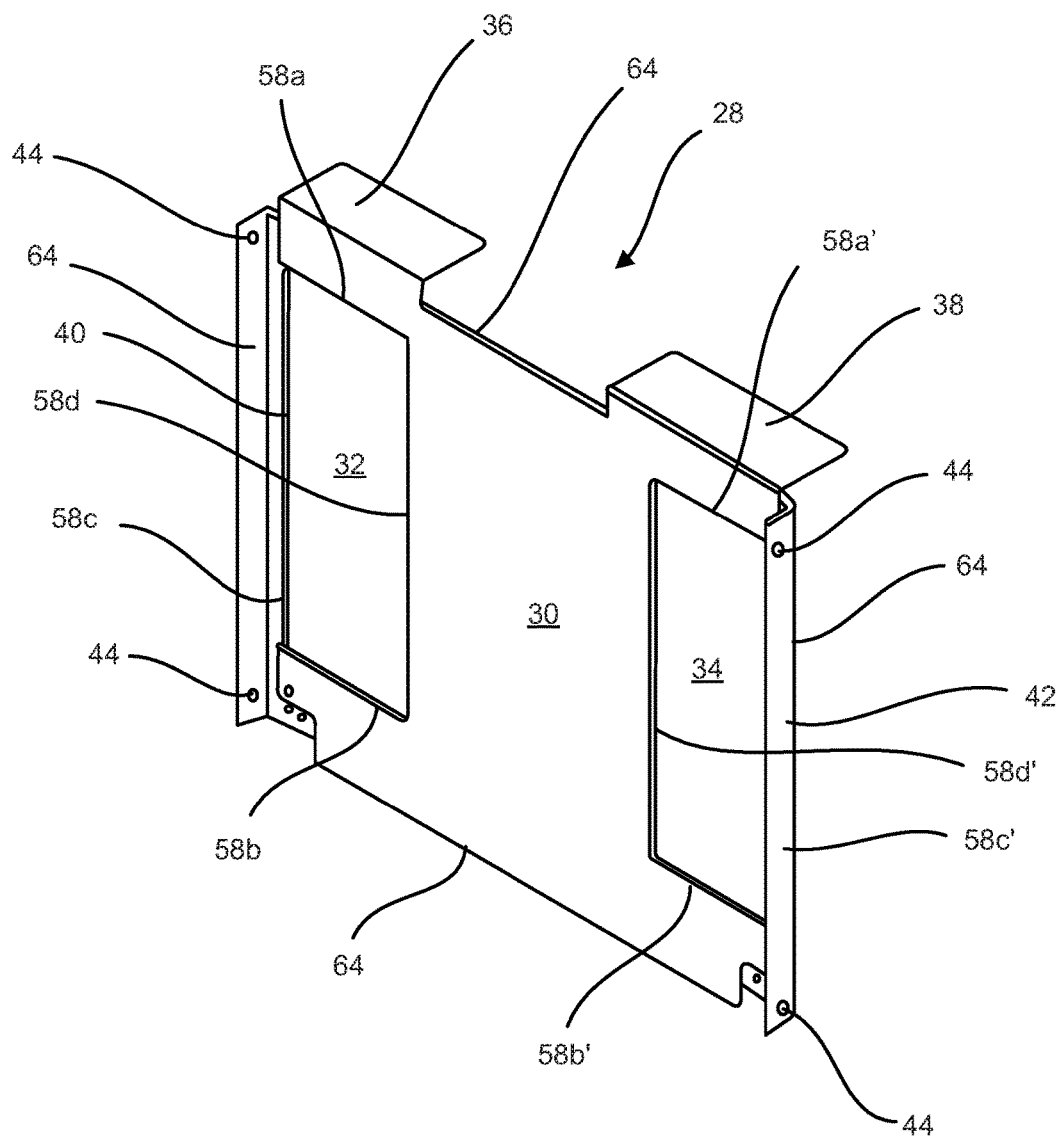
FIG. 3 is a top perspective view of a wall panel assembly for covering a horizontal bar section of an electrical meter center in accordance with another embodiment.

FIG. 3 shows a wall panel assembly 28 for covering the horizontal bar section 12, shown in FIGS. 1-2, of the electrical meter center 10. As shown in FIG. 2 and as described above, the horizontal bar section 12 defines a first connection section 24 (for a stack on the left side) and a second connection section 26 (for a stack on the right side). The second connection section 26 is laterally distant from the first connection section 24. The wall panel assembly 28 includes a wall panel 30 for mounting within the electrical meter center 10 about the horizontal bar section 12 (for covering the horizontal bar section 12 of the electrical meter center 10). The wall panel assembly 28 further includes a first access window 32 defined within the wall panel 30 for accessing the first connection section 24 of the horizontal bar section 12 and a second access window 34, which is laterally distant from the first access window 32. The second access window 34 is also defined within the wall panel 30 for accessing the second connection section 26 of the horizontal bar section 12. The first access window defining window edges 58a-d, and the second access window defining window edges 58a'-d'. It is to be noted that both access windows 32, 34 are covered with access window panels 48, 50 (not illustrated and described in more details in relation with FIG. 6) consisting of rectangular sheet metal, part of the wall panel assembly 28, of the same or slightly larger size as the first and second access windows 32, 34, for easy installation/removal by the customers.

Still referring to FIG. 3, there is shown that the wall panel assembly 28 further includes exterior edges 64 with a first flange 36 (aka a boundary flange) about one exterior edge 64 substantially above the first access window 32. The first flange 36 extends perpendicularly from the wall panel 30 and extends towards the horizontal bar section 12 when the wall panel assembly 28 is installed within the electrical meter center 10. The wall panel assembly 28 further includes a second flange 38 (aka a boundary flange), distant from the first flange 36, about the same exterior edge 64 as the first flange 36, and substantially above the second access window 34. The second flange 38 extends perpendicularly from the wall panel 30 and extends towards the horizontal bar section 12 when the wall panel assembly 28 is installed within the electrical meter center 10.

The wall panel assembly 28 may further include about another exterior edge 64 a third flange 40 (aka a mounting flange) substantially adjacent and aside the first access window 32. The third flange 40 extends perpendicularly from the wall panel 30 and extends away from the horizontal bar section 12 when the wall panel assembly 28 is installed within the electrical meter center 10.

The wall panel assembly 28 may further include about another exterior edge 64, a fourth flange 42 (aka a mounting flange) substantially adjacent and aside the second access window 34. The fourth flange 42 extends perpendicularly from the wall panel 30 and extends away from the horizontal bar section 12 when the wall panel assembly 28 is installed within the electrical meter center 10.

The first, second, third and fourth flanges 36, 38, 40, 42 help in installing and/or mounting the wall panel assembly 28 within the electrical meter center 10 in a way to cover at least partially the horizontal bar section 12, since for regulation and safety reasons, the high voltage and amperage of horizontal bus bars must be protected to avoid any possible short circuiting or contact with human hands or tools like, for example, screw-drivers. It is to be noted that the first and second flanges 36, 38 (boundary flanges) may be integral with the wall panel 30, while the third and fourth flanges 40, 42 (mounting flanges) may alternatively be mounted about the wall panel 30 as separate components using fasteners, such as screws, bolts, and/or nuts. For example, the third and fourth flanges 40, 42 may be mounted directly on the frame of the electrical meter center 10, while the wall panel 30 is being mounted on these third and fourth flanges 40, 42.

Still referring to FIG. 3, there is shown that the third and fourth flanges 40, 42 each include two fastener receiving holes 44 capable of receiving fasteners (such as screws, nails or rivets, or any suitable fastener) for mounting the wall panel 30 on respective interior walls 46 (see FIG. 6) of the electrical meter center 10. Alternatively, when the third and fourth flanges 40, 42 are installed on the frame of the electrical meter center 10, they also include four receiving holes in order to fix the wall panel assembly 28 to them (in the scenario where flanges 40, 42 are separate components as described above).

Figure 4:
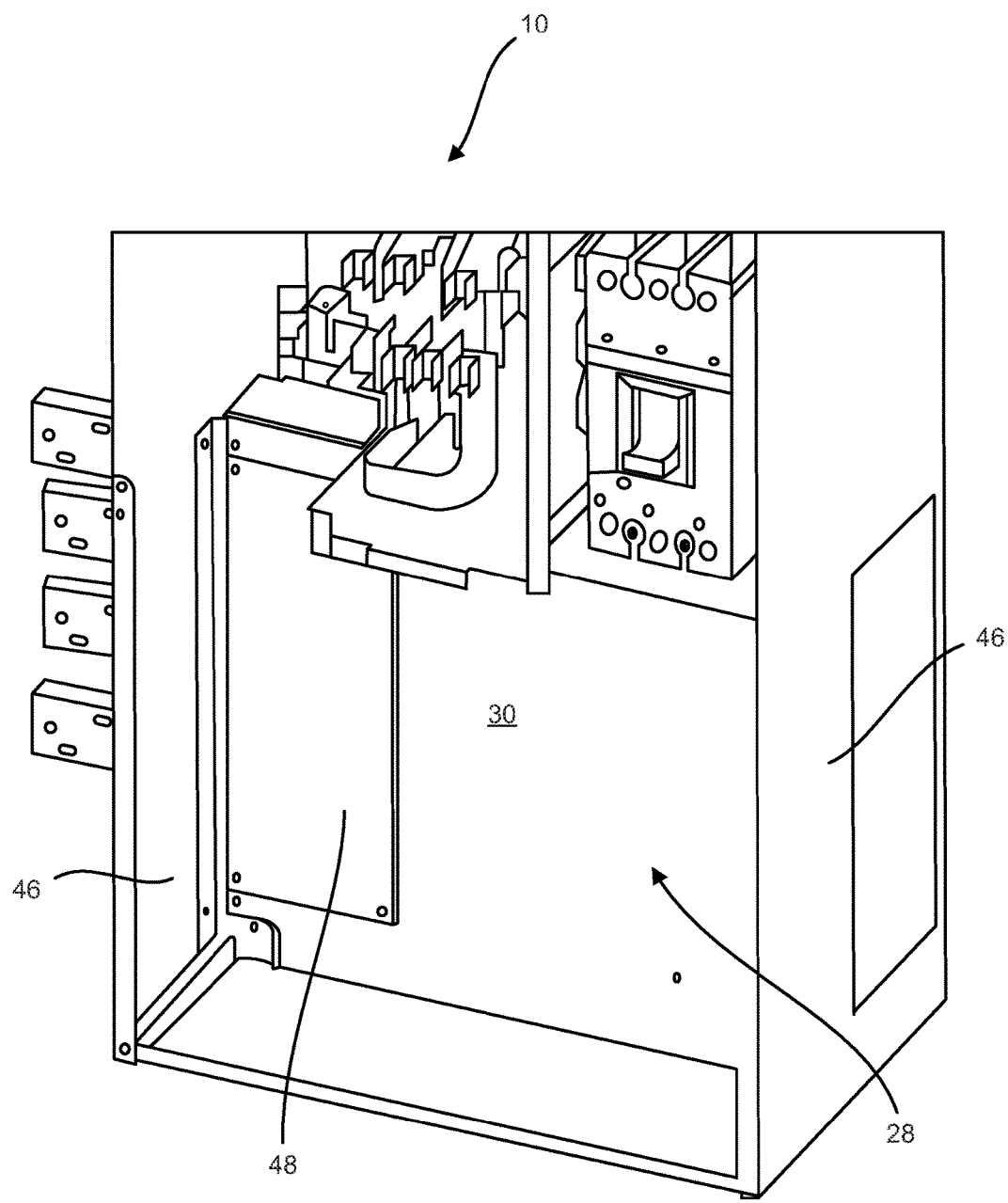
FIG. 4 is a close-up view of the horizontal bar section of the electrical meter center shown in FIG. 1, covered by the wall panel assembly of FIG. 3, and where the first access opening and the second access opening of the wall panel assembly are also covered.

As shown in FIG. 4, the wall panel assembly 28 further includes a first access window panel 48 and a second access window panel 50. The first access window panel 48 is removably mounted (as explained further in relation with FIG. 6) on the wall panel 30 in such a way as to cover the first access window 32. On the other hand, the second access window panel 50 is removably mounted on the wall panel 30 in such a way as to cover the second access window 34. Therefore, when the customers, installers and/or repairmen need to access one or both of the first connection section 24 and the second connection section 26 of the horizontal bar section 12, they do not need to open or uncover the entire horizontal bar section 12 (by removing the whole wall panel assembly 28), which would be impossible when routing cables (not shown) exit at the bottom of the tub, since they are placed in front of the wall panel assembly 28. The customers, installers and/or repairmen only need to open one or both of the first and second access window panel(s) 48, 50.

For example, the customers, installers and/or repairmen may want to access the first connection section 24 by removing the first access window panel 48 to connect the four horizontal bars 20 to the neutral vertical bar (not shown on FIG. 4) or to the four horizontal bars of an electrical meter center installed beside (i.e., on the left side of) the electrical meter center 10. The customers, installers and/or repairmen will therefore only have access to that first connection section 24, but not to the middle section 22 of the horizontal bar section 12 of the electrical meter center 10. Three horizontal bars are mounted over isolators on the neutral, while the last horizontal bar is electrically connected to the neutral vertical bar.

According to another embodiment, and referring now to FIG. 5, there is shown a perspective view of three electrical meter centers 10 (10A, 10B and 10C) installed side to side. According to FIG. 5, the respective horizontal bar section 12 of each electrical meter center 10 is uncovered; normally, the wall panel assembly 28 would remain installed. Therefore, by removing only the first and/or second access window panels 48, 50 of the wall panel assembly 28, the customers, installers and/or repairmen may be able to perform additional tasks. For example, they may be able to stack two additional electrical meter centers 10 (second and third electrical meter centers 10B, 10C) adjacent the first electrical meter center 10A and perform the suitable electrical connections. The customers, installers and/or repairmen therefore do not have to remove one and only one large and heavy panel (not shown) covering the whole interior portion of the electrical meter center 10 during post-initial installation of the first electrical meter center 10A. It is also to be noted that for bottom routing of customer wires/cables, such a large and heavy panel for horizontal bars may not be removable at all, therefore not allowing an easy stack addition.

Figure 6:
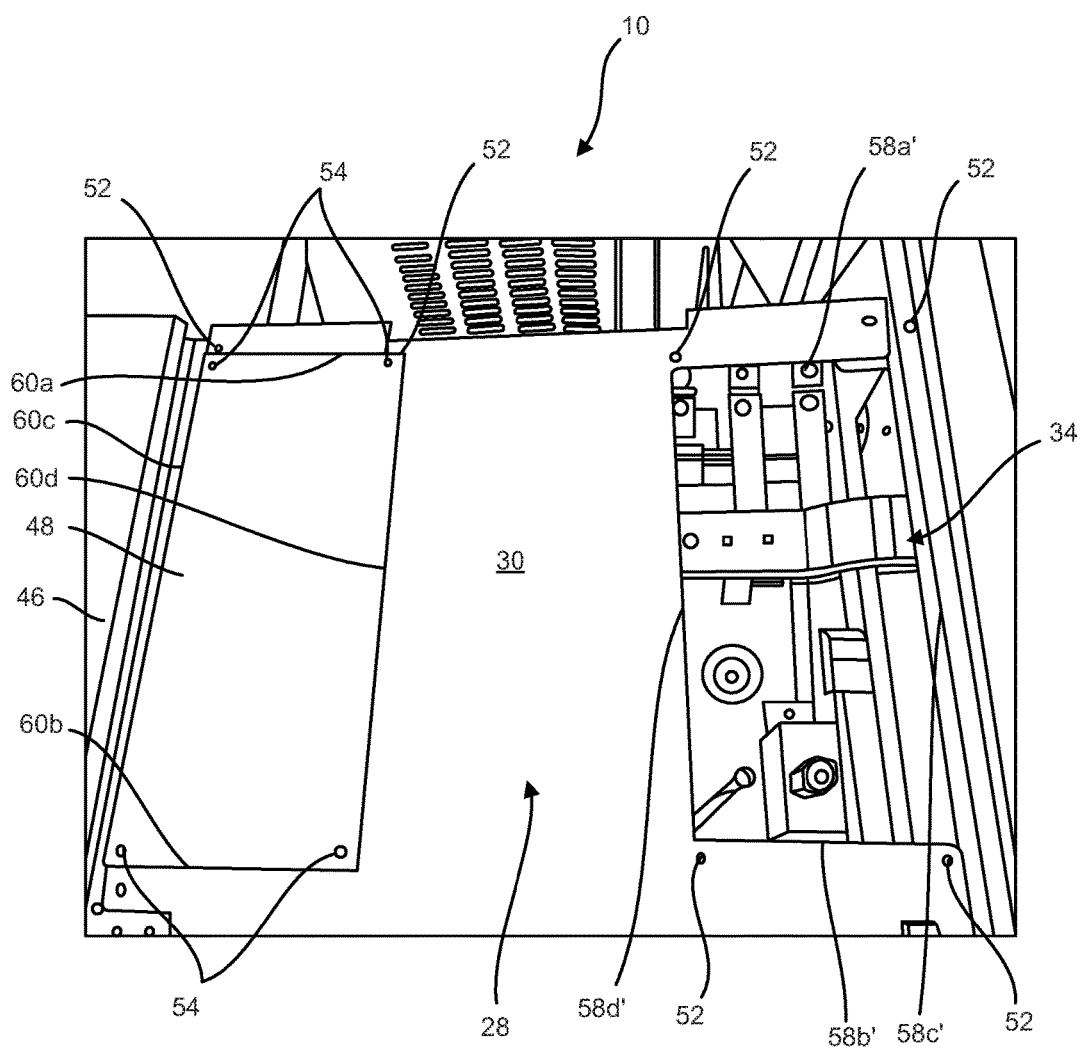
FIG. 6 is a picture showing a close-up view of the wall panel assembly mounted on the electrical meter center covering partially the horizontal bar section of the electrical meter center.

FIG. 6 is a picture showing a portion of the wall panel assembly 28 installed within an electrical meter center 10. As shown, the first access window 32 is covered by the first access window panel 48 (having four window panel edges 60a-d) while the second access window 34 is uncovered by the second access window panel 50 (not visible). As shown in FIG. 6, the wall panel 30 includes four fastener receiving holes 52 about the four corners of the second access window 34 for removable mounting of the second access window panel 50. Thus, the customers, installers and/or repairmen are capable of fastening the second access window panel 50 above (to cover) the second access window 34 using four fasteners (such as screws or any suitable fasteners) using the four window panel holes 54 and corresponding four fastener receiving holes 52 defined within the wall panel 30 of the wall panel assembly 28. Even if it is not well shown in FIG. 6, the wall panel 30 further includes four fastener receiving holes 52 about the four corners of the first access window 32. This is why the customers, installers and/or repairmen are capable of fastening the first access window panel 48 above (to cover) the first access window 32 using four fasteners (such as screws or any suitable fasteners) using the four fastener receiving holes 52 defined within the wall panel 30 of the wall panel assembly 28.

According to an alternative embodiment (FIGS. 11a-c), the first and second access window panel 48, 50 feature notches 56 allowing the first access window panel 48 and second access window panel 50 to be either attached to the wall panel 30 when screws are firmly screwed and to be slid away from the access windows 32, 34 when some screws are removed and other are loosely in place. The notches 56 may be vertically oriented (FIG. 11b), horizontally oriented (FIG. 11a) or even in a rectangular shape (FIG. 11c) reaching adjacent edges of the first or second access window panel 48, 50.

Figure 12:
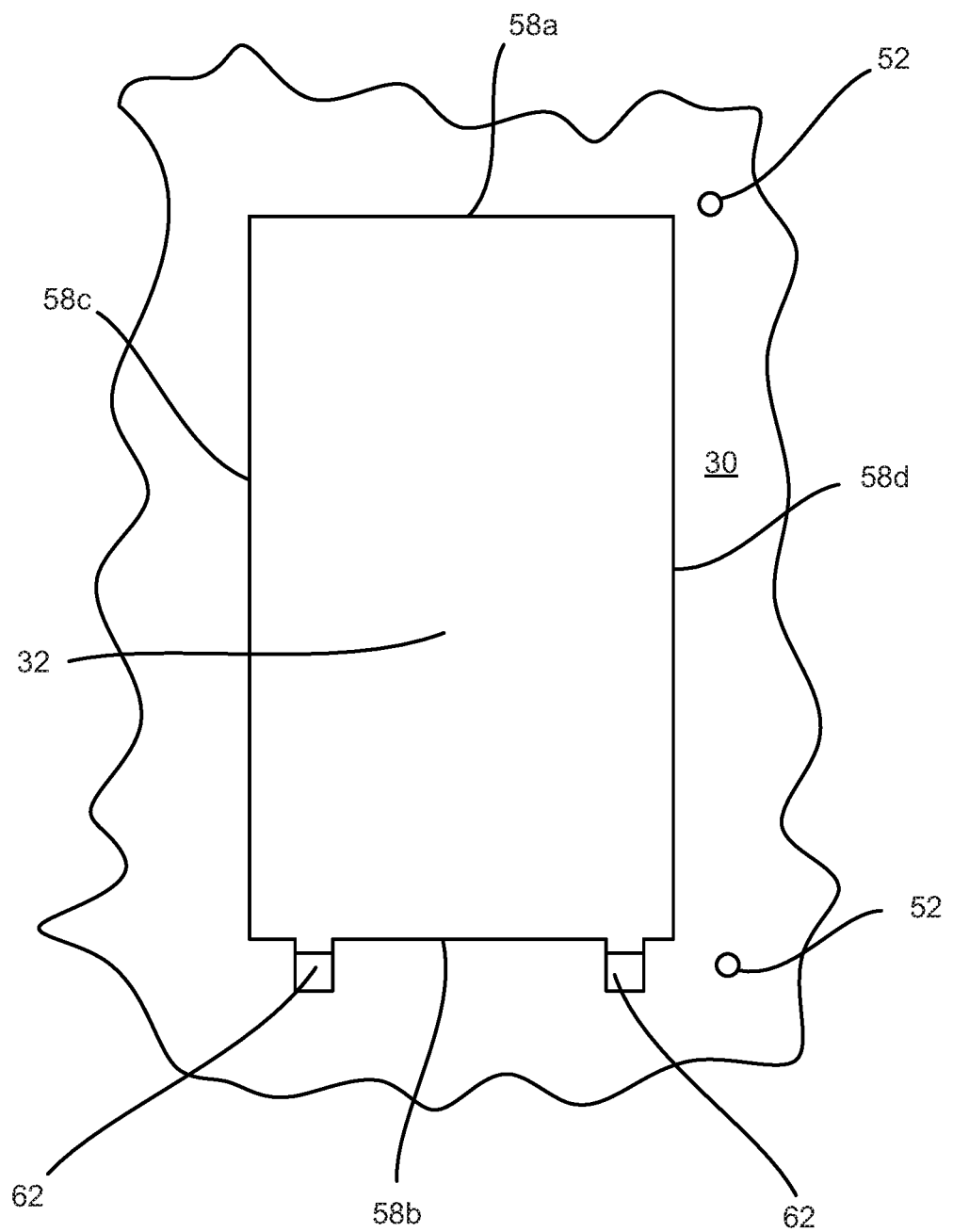
FIG. 12 is a partial front elevation view of the wall panel assembly for covering a horizontal bar section of an electrical meter center in accordance with another embodiment.

According to an alternative embodiment (FIG. 12), the first and second access window panels 48, 50 (not illustrated) consist of a substantially flat panel with holes 54 or notches 56 according to a single edge 60d. The wall panel 30 along window edges 58a, 58a', 58b, 58b' and 58c, 58c' features pulled out fingers 62 creating recesses along the window edges 58a, 58a', 58b, 58b' and 58c, 58c' of first and second access window panels 48, 50 to either slide transversally along the window edges 58a, 58a' and 58b, 58b' or to house the window panel edge 58c, 58c' of the first and second access window panels 48, 50. Thus, the first and second access window panels 48, 50 can be mounted on or dismounted from the wall panel 30 through a sliding motion. Close to the fourth window edge 58d, 58d' are fastener receiving holes 52 to securely fasten the first and second access window panels 48, 50 to the wall panel 30.

Alternatively (FIG. 11d), one or two edges (i.e. the bottom window panel edge 58b, 58b' and the extreme edge 58c, 58c' that is most distant from the other access window 34, 32) may feature an C-shaped folded configuration (not illustrated) defining a groove to mount the access window panel 48, 50 over the access window 32, 34, thereby reducing the number of fastening components to the edges 60 or corner(s) opposed to the mounting mechanism. Accordingly, with this alternative embodiment, a single screw would be required to be manipulated to mount or to dismount each of the access window panels 48, 50 on or from the wall panel 30.

Figure 13:
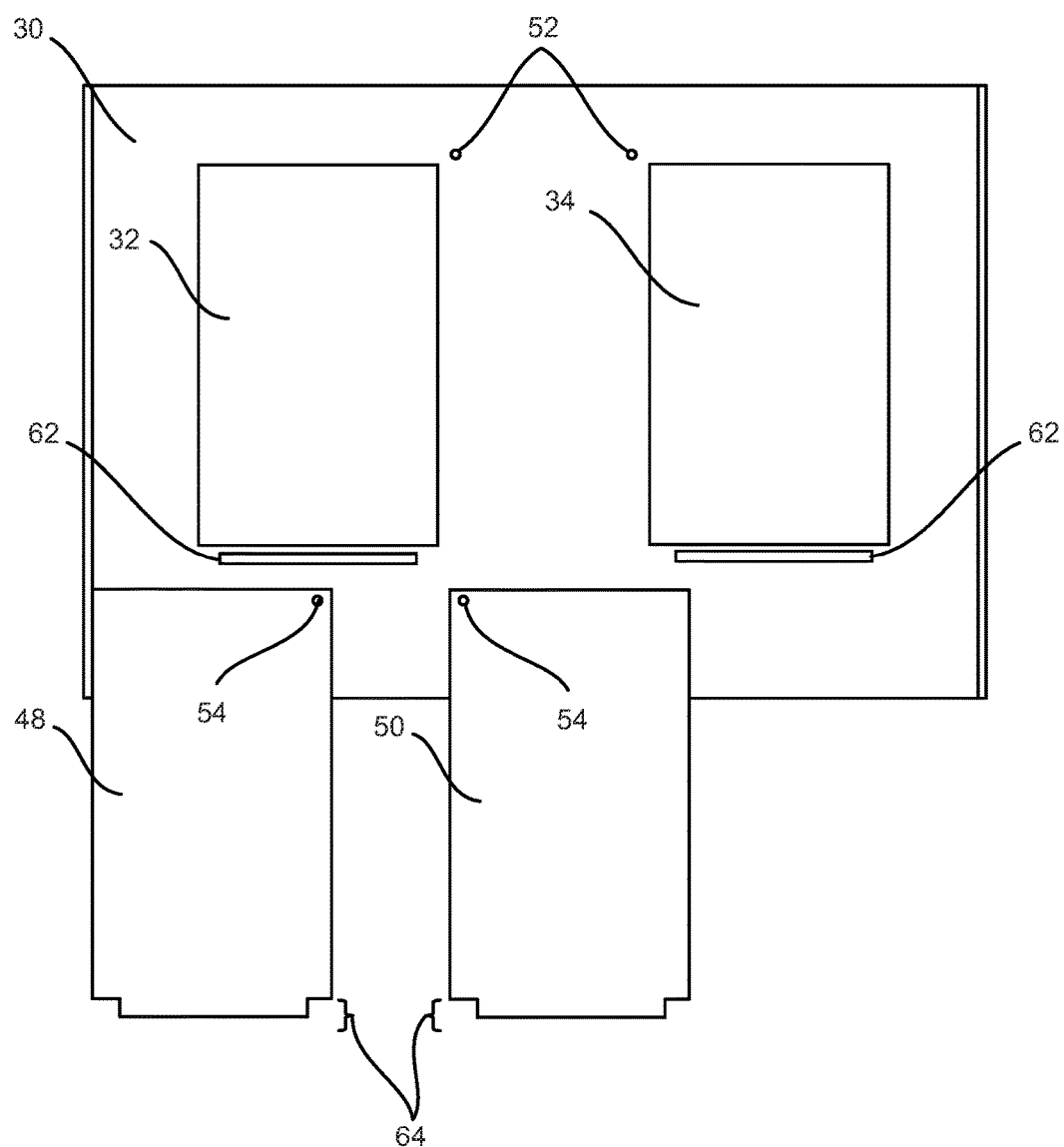
FIG. 13 is a front elevation view of the wall panel assembly for covering a horizontal bar section of an electrical meter center in accordance with yet another embodiment.

According to another embodiment shown in FIG. 13, the wall panel 30 comprises a slit 62 near a lower edge of the first access window 32 and the second access window 34. Alternatively, the wall panel 30 may comprise at least one of a bracket, a hook member and an extension (not shown). The first access window panel 48 and the second access window panel 50 comprise extensions 64 at a bottom edge thereof which interface with the slit 62 (or alternatively depending on embodiments the bracket(s), the hook member(s) or the extension(s)) to support the first access window panel 48 and the second access window panel 50 at the bottom edge. When used in conjunction with fasteners and the plurality of holes 52 in the wall panel 30 and holes 54 in the access windows 48, 50, the at least one of the first access window panel 48 and second access window panel 50 will be selectively mounted to the wall panel 30.

According to embodiments, it becomes possible to have identical first and second access window panels 48, 50, allowing interchangeability. Furthermore, they may be symmetric along a horizontal axis or vertical axis, permitting to mount them in multiple, or even in any orientation.

Figure 7:
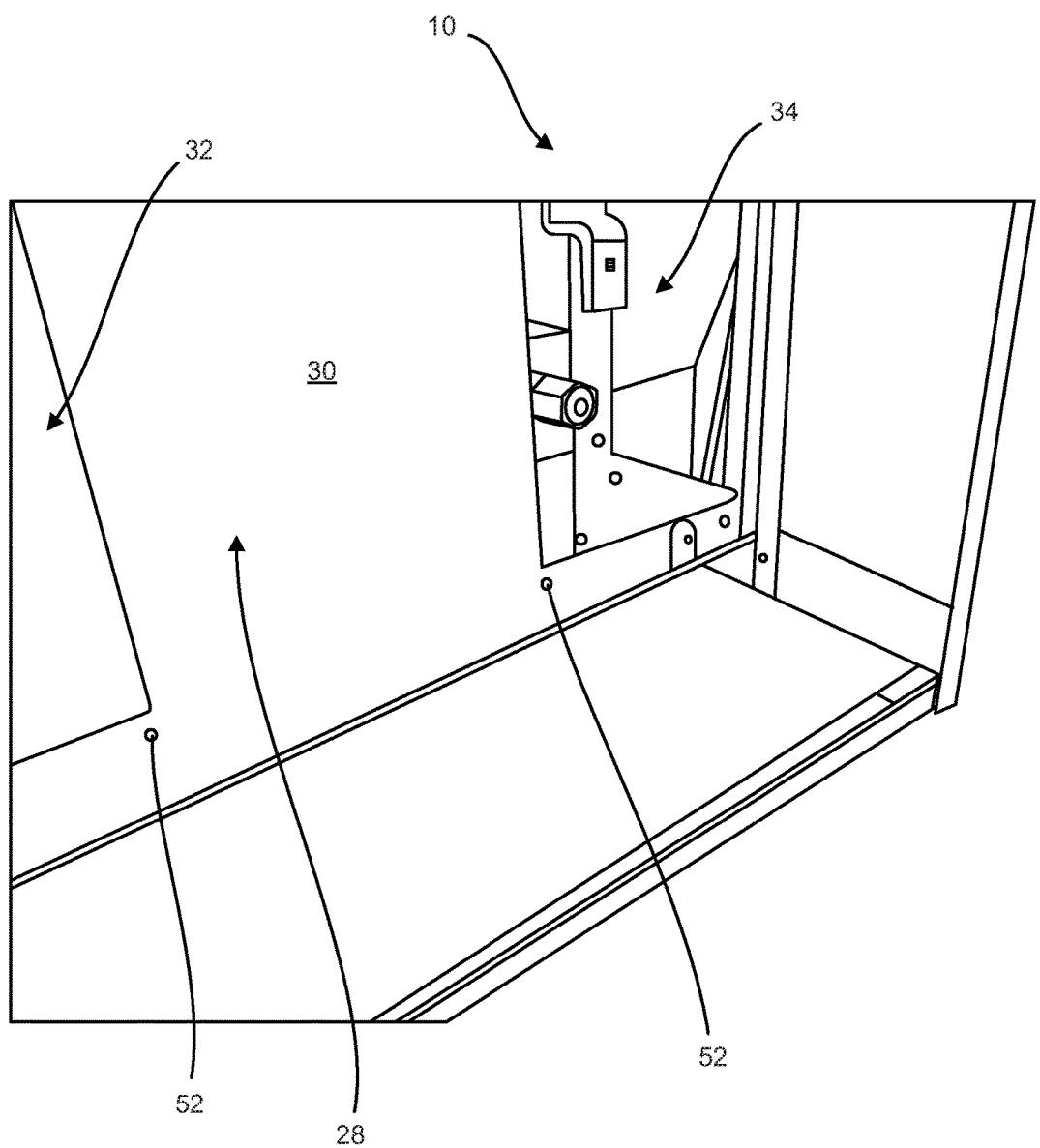
FIG. 7 is a picture showing a close-up view of the wall panel assembly mounted on the electrical meter center, to cover partially the horizontal bar section of the electrical meter center, not yet installed.
Figure 8:
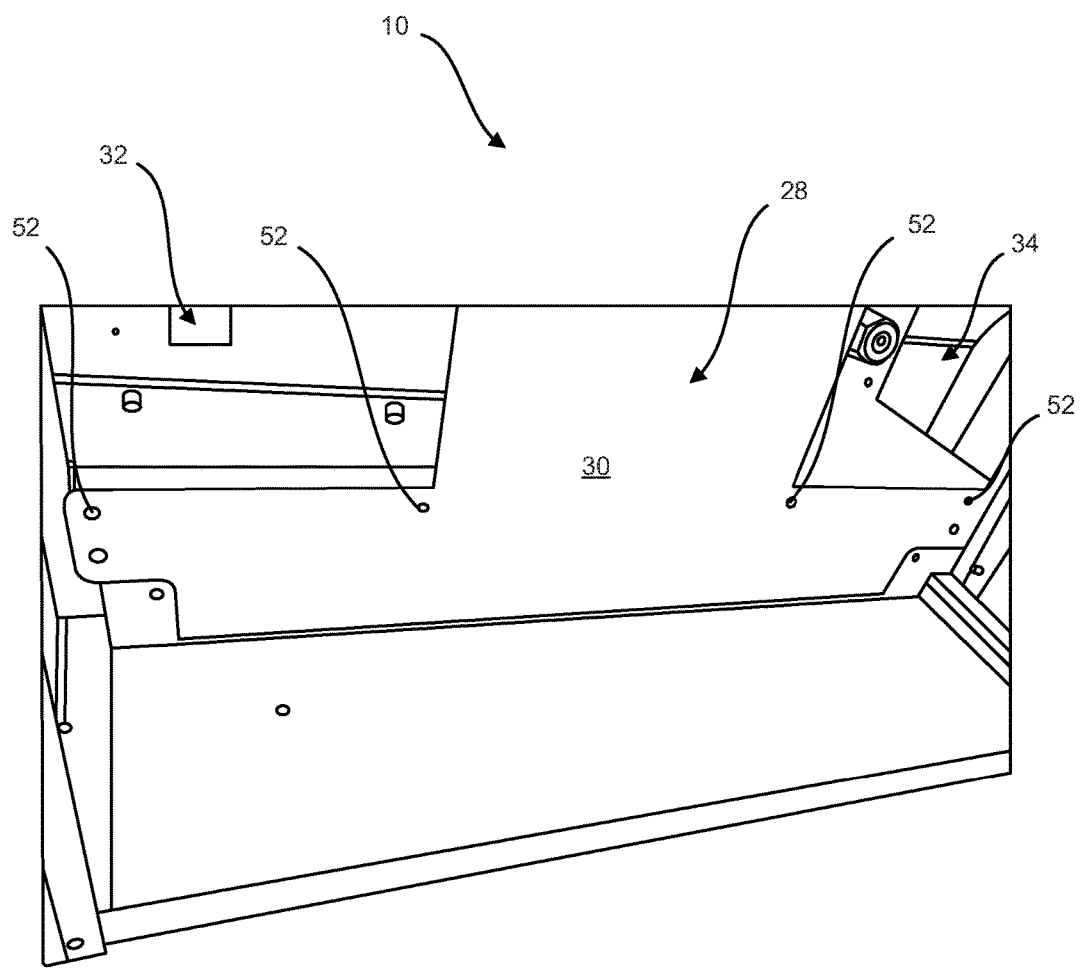
FIG. 8 is another picture showing a close-up view of the wall panel assembly mounted on the electrical meter center, also to cover partially the horizontal bar section of the electrical meter center, not yet installed.
Figure 9:
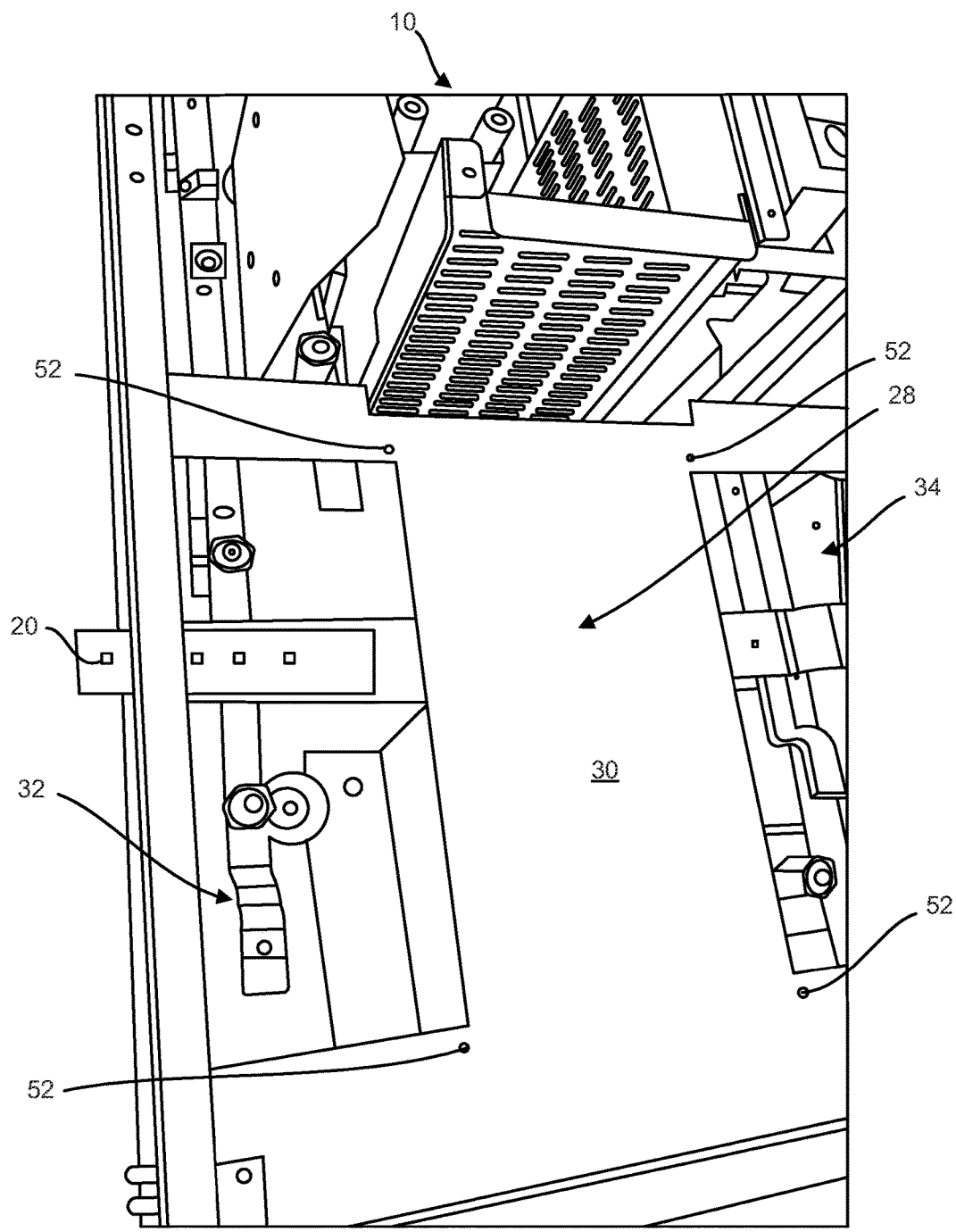
FIG. 9 is another picture showing a close-up view of the wall panel assembly mounted on the electrical meter center, also to cover partially the horizontal bar section of the electrical meter center, which is in installation.

FIGS. 7, 8 and 9 further show a wall panel assembly 28 installed within the electrical meter center 10. As shown in FIGS. 7-9, both the first and second access windows 32, 34 are uncovered.

Figure 10:
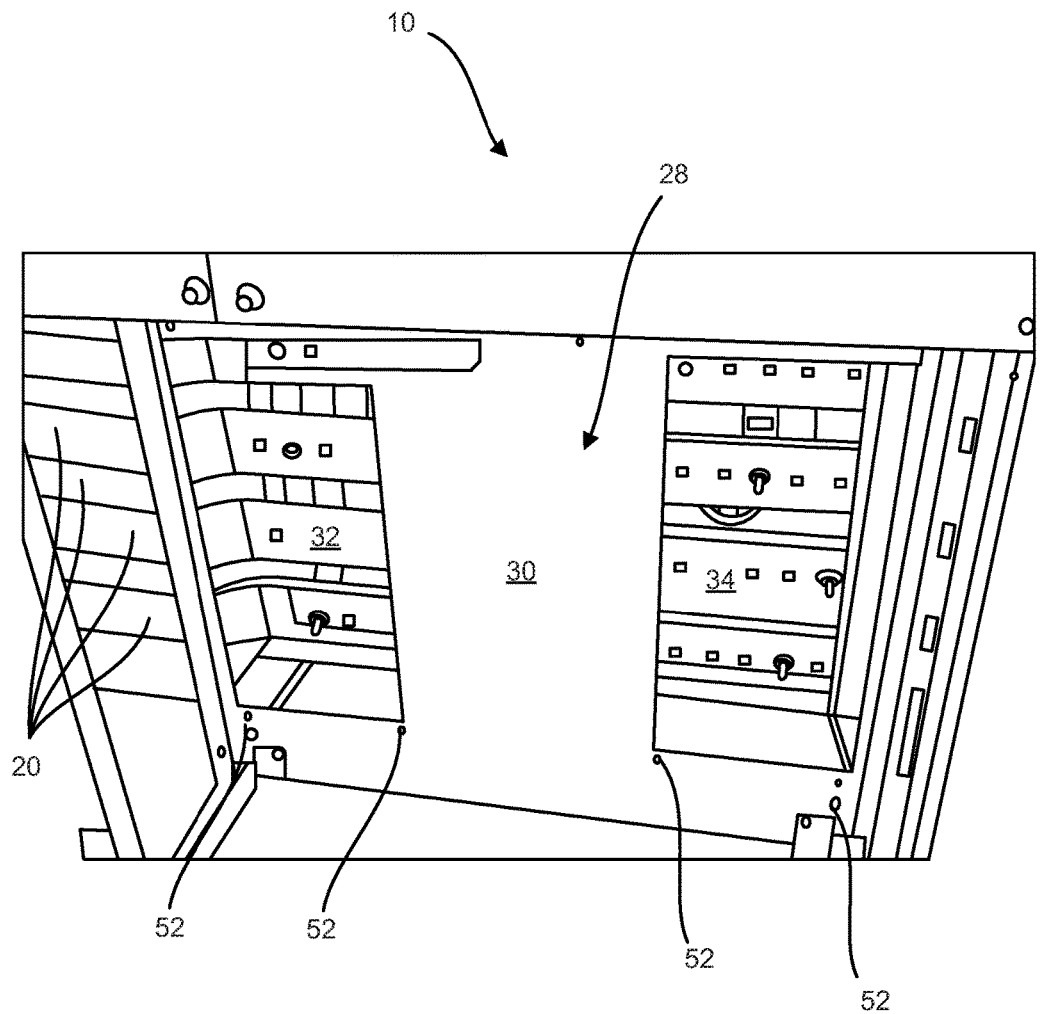
FIG. 10 is a picture showing the wall panel assembly mounted on the electrical meter center, also covering partially the horizontal bar section of the electrical meter center.

Referring now to FIG. 10, there is also shown a wall panel assembly 28 mounted within an electrical meter center 10. Also shown in FIG. 10, both the first and second access windows 32, 34 are uncovered, and all horizontal bars 20 are installed, and exit on the left side.

Is to be noted that the wall panel 30, as the first and second access window panels 48, 50 may be made of steel, or another metallic material. Further, they may be made of substantially flat material, sheet material, allowing their manufacturing using sheet-metal manufacturing techniques such as cutting, punching for economic advantages.

The wall panel assembly 28 as described above and/or the first and second access windows 32, 34 of the wall panel assembly 28 may help the customers, installers and/or repairmen in quickly, easily and more safely stack additional electrical meter centers 10 post-initial installation of a first electrical meter center 10A (FIG. 5).

The wall panel assembly 28 as described above and/or the first and second access windows 32, 34 of the wall panel assembly 28 therefore permits quick and easy access to the first and second connection sections 24, 26 of the horizontal bar section 12 within the electrical meter center 10.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A wall panel assembly for covering a horizontal bar section of an electrical meter center, the wall panel assembly comprising:
    a wall panel vertically mounted within the electrical meter center in front of the horizontal bar section, the wall panel comprising an access window for accessing the horizontal bar section;
    an access window panel selectively mounted to the wall panel to at least partially close the access window thereby providing selective access to the horizontal bar section, wherein the access window comprises a first access window and a second access window;
    a first flange disposed about one exterior edge substantially above the first access window such that the first flange extends perpendicularly from the wall panel and extends towards the horizontal bar section when the wall panel assembly is installed within the electrical meter center; and
    a second flange distant from the first flange, disposed about the one exterior edge as the first flange and substantially above the second access window such that the second flange extends perpendicularly from the wall panel and extends towards the horizontal bar section when the wall panel assembly is installed within the electrical meter center.

2. The wall panel assembly of claim 1, wherein the access window panel comprises a first access window panel and a second access window panel, each one of the first access window panel and the second access window panel being selectively mounted to the wall panel to at least partially close a corresponding one of the first access window and the second access window thereby providing selective access to two sections of the horizontal bar section.

3. The wall panel assembly of claim 2, wherein the first access window panel and second access window panel are symmetric according to at least one of a horizontal axis and a vertical axis.

4. The wall panel assembly of claim 1, wherein the wall panel and the access window panel are made of sheet metal material.

5. The wall panel assembly of claim 1, wherein the wall panel and the access window panel each comprise at least one hole, wherein the at least one hole in each one of the wall panel and the access window panel are adapted for selectively fastening the access window panel to the wall panel.

6. The wall panel assembly of claim 5, wherein the access window panel and comprises notches which when used in conjunction with fasteners and the at least one hole in the wall panel selectively mount the at least one of the access window panel to the wall panel.

7. An electrical meter center comprising:
    a horizontal bar section comprising horizontal bus bars, the horizontal bar section defining a first connection section for the horizontal bus bars and a second connection section for the horizontal bus bars, the second connection section being laterally distant from the first connection section; and
    a wall panel assembly for covering a horizontal bar section of an electrical meter center, the wall panel assembly comprising:
        a wall panel vertically mounted within the electrical meter center in front of the horizontal bar section, the wall panel comprising an access window for accessing the horizontal bar section;
        an access window panel selectively mounted to the wall panel to at least partially close the access window thereby providing selective access to the horizontal bar section, wherein the access window comprises a first access window and a second access window;
        a first flange disposed about one exterior edge substantially above the first access window such that the first flange extends perpendicularly from the wall panel and extends towards the horizontal bar section when the wall panel assembly is installed within the electrical meter center; and
        a second flange distant from the first flange, disposed about the one exterior edge as the first flange and substantially above the second access window such that the second flange extends perpendicularly from the wall panel and extends towards the horizontal bar section when the wall panel assembly is installed within the electrical meter center.

8. The electrical meter center of claim 7, wherein the access window panel comprises a first access window panel and a second access window panel, each one of the first access window panel and the second access window panel being selectively mounted to the wall panel to at least partially close a corresponding one of the first access window and the second access window thereby providing selective access to two sections of the horizontal bar section.

9. The electrical meter center of claim 8, wherein the first access window panel and second access window panel are symmetric according to at least one of a horizontal axis and a vertical axis.

10. The electrical meter center of claim 7, wherein the wall panel and the access window panel are made of sheet metal material.

11. The electrical meter center of claim 7, wherein the wall panel and the access window panel each comprise at least one hole, wherein the at least one hole in each one of the wall panel and the access window panel are adapted for selectively fastening the access window panel to the wall panel.

12. The electrical meter center of claim 11, wherein the access window panel and comprises notches which when used in conjunction with fasteners and the at least one hole in the wall panel selectively mount the at least one of the access window panel to the wall panel.

* * * * *